(12) United States Patent
Lin et al.

(10) Patent No.: US 10,824,210 B2
(45) Date of Patent: Nov. 3, 2020

(54) EXTERNAL HEAT DISSIPATION DEVICE AND TEMPERATURE ADJUSTING DEVICE

(71) Applicant: Cooler Master Co., Ltd., New Taipei (TW)

(72) Inventors: Wen-Hsien Lin, New Taipei (TW); Chien-Liang Lin, New Taipei (TW)

(73) Assignee: COOLER MASTER CO., LTD., New Taipei (TW)

( * ) Notice: Subject to any disclaimer, the term of this patent is extended or adjusted under 35 U.S.C. 154(b) by 295 days.

(21) Appl. No.: 16/140,623

(22) Filed: Sep. 25, 2018

(65) Prior Publication Data

US 2019/0354149 A1    Nov. 21, 2019

(30) Foreign Application Priority Data

May 21, 2018   (TW) .............................. 107117249 A

(51) Int. Cl.
| | | |
|---|---|---|
| *G06F 1/20* | (2006.01) | |
| *F25B 21/00* | (2006.01) | |
| *G06F 1/16* | (2006.01) | |
| *F24F 5/00* | (2006.01) | |
| *H05K 7/20* | (2006.01) | |

(52) U.S. Cl.
CPC .............. *G06F 1/203* (2013.01); *F25B 21/00* (2013.01); *G06F 1/1632* (2013.01); *F24F 5/0042* (2013.01); *H05K 7/20145* (2013.01)

(58) Field of Classification Search
CPC ... G06F 1/203; G06F 1/1632; H05K 7/20145; F24F 5/0042
See application file for complete search history.

(56) References Cited

U.S. PATENT DOCUMENTS

| | | | | |
|---|---|---|---|---|
| 6,094,347 A | * | 7/2000 | Bhatia ..................... | G06F 1/203 165/104.33 |
| 6,459,574 B1 | * | 10/2002 | Ghosh ................... | G06F 1/1632 165/80.4 |
| 6,837,057 B2 | * | 1/2005 | Pokharna ................ | G06F 1/203 361/679.41 |
| 7,082,773 B2 | * | 8/2006 | Cauchy .................. | B60N 3/101 62/3.3 |

(Continued)

*Primary Examiner* — Frantz F Jules
*Assistant Examiner* — Lionel Nouketcha
(74) *Attorney, Agent, or Firm* — Locke Lord LLP; Tim Tingkang Xia, Esq

(57) ABSTRACT

An external heat dissipation device includes an airflow-guiding base and a refrigerating device. The airflow-guiding base has a supporting surface and a perforation located thereon. The refrigerating device includes a casing, a thermoelectric cooler, a cold air transferring assembly and a hot air transferring assembly. The casing has a storage space. The thermoelectric cooler is located in the storage space and has a cooling surface and a heat releasing surface opposite to each other. The cold air transferring assembly includes a cooling plate and a cooling radiator, and the cooling plate is in thermal contact with the cooling surface. The hot air transferring assembly includes a cooling plate and a cooling radiator, and the cooling plate is in thermal contact with the heat releasing surface. The storage space is divided into a cold chamber and a hot chamber by the thermoelectric cooler and the cooling plates.

19 Claims, 6 Drawing Sheets

(56) References Cited

U.S. PATENT DOCUMENTS

| | | | | |
|---|---|---|---|---|
| 8,000,099 B2* | 8/2011 | Parker | ............... | G06F 1/203 |
| | | | | 361/679.48 |
| 2010/0134977 A1* | 6/2010 | Chang | ............... | G06F 1/203 |
| | | | | 361/695 |
| 2011/0073278 A1* | 3/2011 | Ting | ............... | G06F 1/203 |
| | | | | 165/80.2 |
| 2017/0273214 A1* | 9/2017 | Casparian | ............... | G06F 1/1632 |

* cited by examiner

EXTERNAL HEAT DISSIPATION DEVICE AND TEMPERATURE ADJUSTING DEVICE

CROSS-REFERENCE TO RELATED APPLICATIONS

This non-provisional application claims priority under 35 U.S.C. § 119(a) on Patent Application No(s). 107117249 filed in Taiwan on May 21, 2018, the entire contents of which are hereby incorporated by reference.

TECHNICAL FIELD

The disclosure relates to an external heat dissipation device and a temperature adjusting device, more particularly to an external heat dissipation device and a temperature adjusting device that are configured to improve the heat dissipation efficiency of a portable electronic device.

BACKGROUND

With the changing habits of people using computer, laptop computers become an important product type in the market. The laptop computers are small, light and portable enough for people to carry them around, which allows people to use the laptop computer at home, office or during commuting and flights. For example, people can use their laptop computer to do work in the office or at home, to read articles or watch clips online in a coffee shop, or even to play online games with friends. Some of the laptop computers are equipped with higher-end processors and graphics cards for users to play online games or watch video clips at a higher-resolutions and higher graphics settings. The higher-end processors and graphics cards need more power to run, and more power leads to more heat. However, the volume of the laptop computers is relatively small, thereby only allowing a small heat dissipation device (or a small amount of heat dissipation devices) to be installed therein, and usually, the small heat dissipation device has limited cooling effect, thereby resulting unsatisfied heat dissipation efficiency.

Conventionally, some laptop computers have fans inside their casing. The fans can draw external air from the bottom of the casing and then to blow out the air from the lateral sides or rear side of the casing. While the air is flowing through the casing, it can bring the heat away so as to cool the laptop computer. However, the bottom of the casing is usually very close to or in tight contact with a desk surface, thus the fans hard to draw air into the casing, and the external air drawn by the fan is merely at room temperature and thus has a limited cooling effect.

SUMMARY

The present disclosure provides an external heat dissipation device and a temperature adjusting device that allow portable electronic devices to draw air having a temperature lower than room temperature, thereby improving the heat dissipation efficiency.

One embodiment of the disclosure provides an external heat dissipation device which is configured to be applied to a portable electronic device. The external heat dissipation device includes an airflow-guiding base and a refrigerating device. The airflow-guiding base has a supporting surface and at least one perforation. The supporting surface is configured to support the portable electronic device. The at least one perforation is located on the supporting surface. The refrigerating device includes a casing, at least one thermoelectric cooler, a cold air transferring assembly and a hot air transferring assembly. The casing has a storage space, at least one vent, a first air outlet and a second air outlet. The at least one vent is connected to the storage space. The first air outlet is connected to the perforation. The thermoelectric cooler is located in the storage space, and the thermoelectric cooler has a cooling surface and a heat releasing surface opposite to each other. The cold air transferring assembly includes a first cooling plate and a first cooling radiator connected to each other. The first cooling plate is in thermal contact with the cooling surface of the thermoelectric cooler. The hot air transferring assembly includes a second cooling plate and a second cooling radiator connected to each other. The second cooling plate is in thermal contact with the heat releasing surface of the thermoelectric cooler. In addition, the storage space is divided into a cold chamber and a hot chamber by the thermoelectric cooler, the first cooling plate and the second cooling plate. The cold chamber is connected to the first air outlet, and the hot chamber is connected to the second air outlet.

One embodiment of the disclosure provides a temperature adjusting device. The temperature adjusting device includes a casing, at least one thermoelectric cooler, a power supply and a switch. The casing has a storage space, at least one vent and a first air outlet. The at least one vent is connected to the storage space. The first air outlet is connected to the perforation. The at least one thermoelectric cooler is located in the storage space, and the at least one thermoelectric cooler has a cooling surface and a heat releasing surface opposite to each other. The at least one thermoelectric cooler has a first anode and a first cathode. The power supply is located in the storage space, and the power supply has a second anode and a second cathode. The first anode and the first cathode of the thermoelectric cooler are connected to the second anode and the second cathode of the power supply through the switch, and a connection among the first anode, the first cathode, the second anode and the second cathode is switchable by the switch so as to blow a cold air generated by the cooling surface of the thermoelectric cooler toward the first air outlet or to blow a hot air generated by the heat releasing surface of the thermoelectric cooler toward the first air outlet.

According to the external heat dissipation device and the temperature adjusting device as described above, the lower room is divided into the cold chamber and the hot chamber by the thermoelectric coolers, the first cooling plate, and the second cooling plate, the hot air in the hot chamber does not easily flow back to the cold chamber hot chamber, and thus the temperature of the cold air in the cold chamber is not increased by the hot air. Therefore, the external heat dissipation device is able to provide the cold air having lower temperature to the portable electronic device, thereby increasing the heat dissipation effect of the external heat dissipation device to the portable electronic device.

Furthermore, the power supply and the thermoelectric coolers are connected by the switch, and the switch can switch the operation modes of the thermoelectric coolers, such that the external heat dissipation device can function as a temperature adjusting device to optionally provide cold air or warm air. For example, when the portable electronic device needs to be cooled, the switch is switched to the desired mode so that cold chamber is connected to the first air outlet. For another example, by switching the switch, the hot chamber is able to be connected to the first air outlet so as to provide warm air to the user.

BRIEF DESCRIPTION OF THE DRAWINGS

The present disclosure will become more fully understood from the detailed description given hereinbelow and the accompanying drawings which are given by way of illustration only and thus are not intending to limit the present disclosure and wherein.

DETAILED DESCRIPTION

Figure 1:
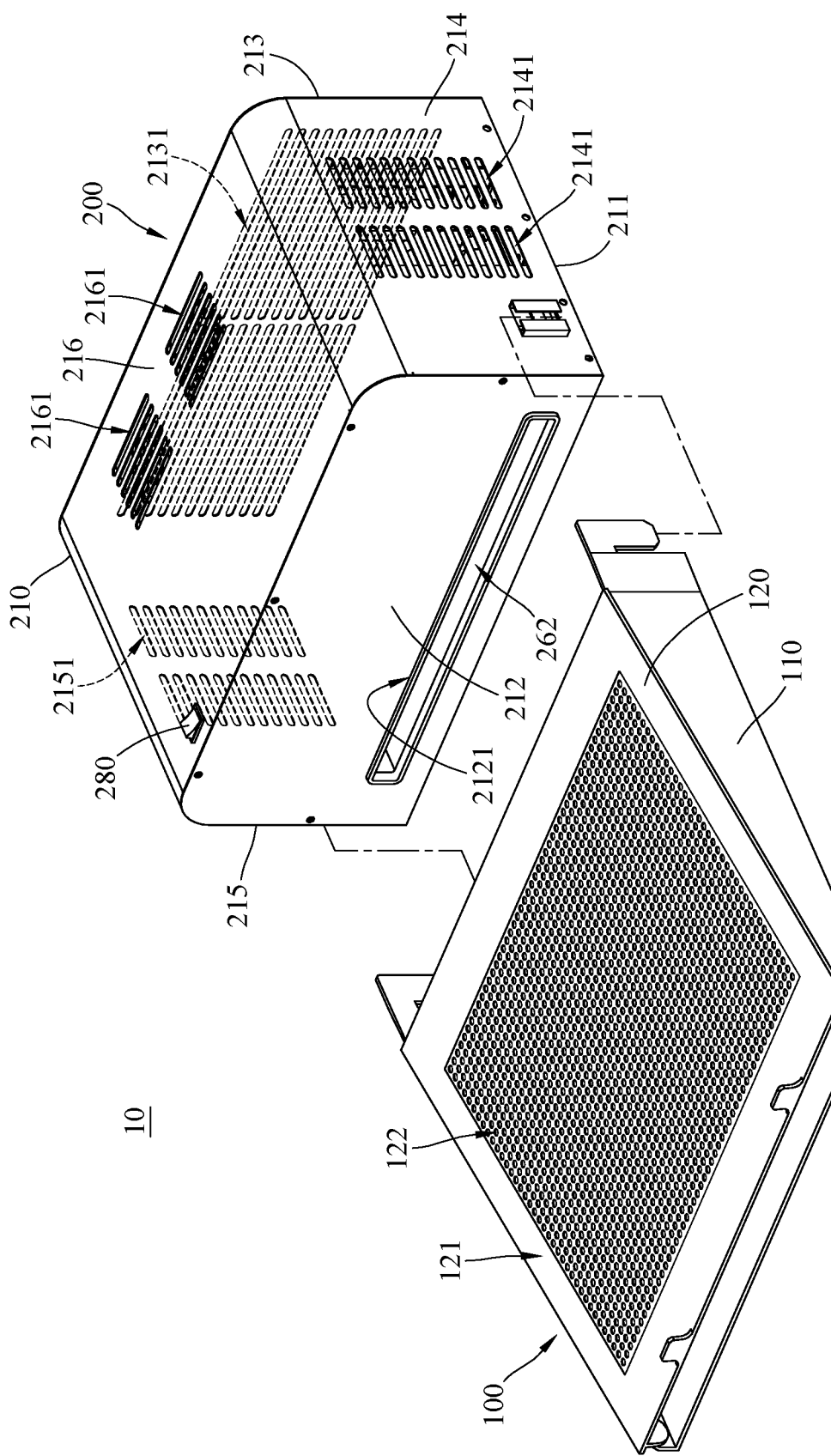
FIG. 1 is an exploded view of an external heat dissipation device in accordance with a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known accommodation structures and devices are schematically shown in order to simplify the drawing.

Figure 2:
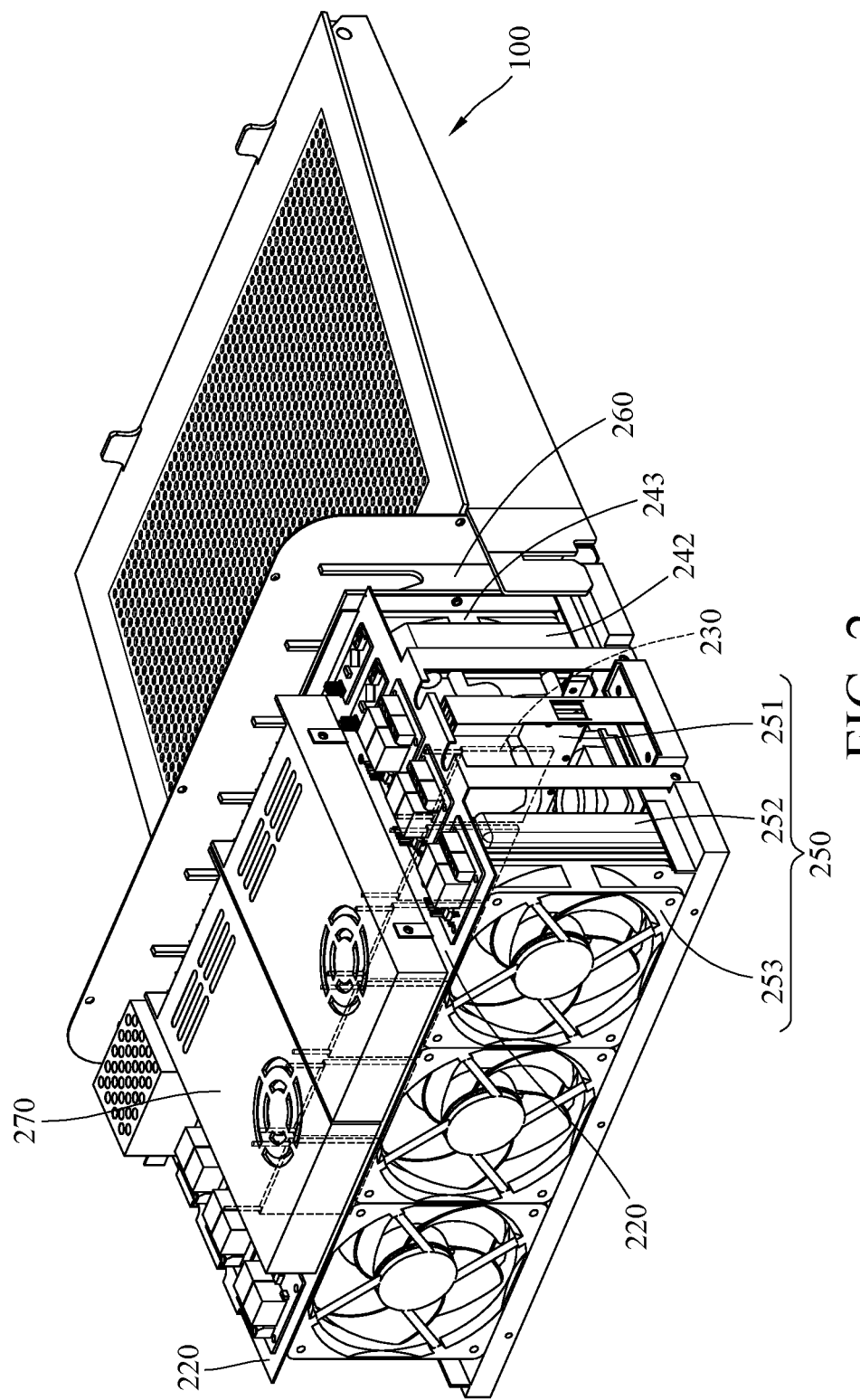
FIG. 2 is a perspective view of the external heat dissipation without showing a casing of a refrigerating device.
Figure 3:
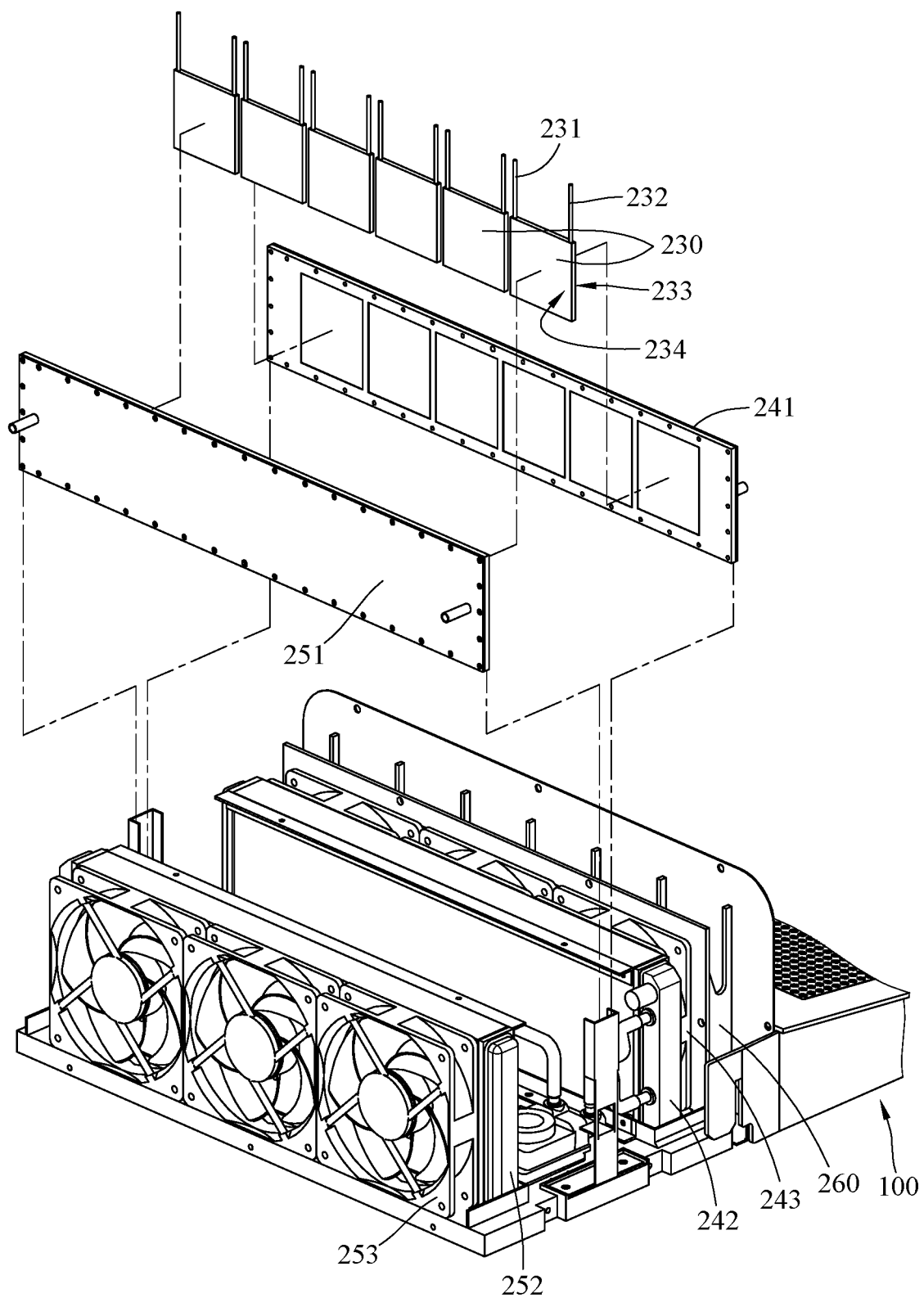
FIG. 3 is a partial and exploded view of FIG. 2.
Figure 4:
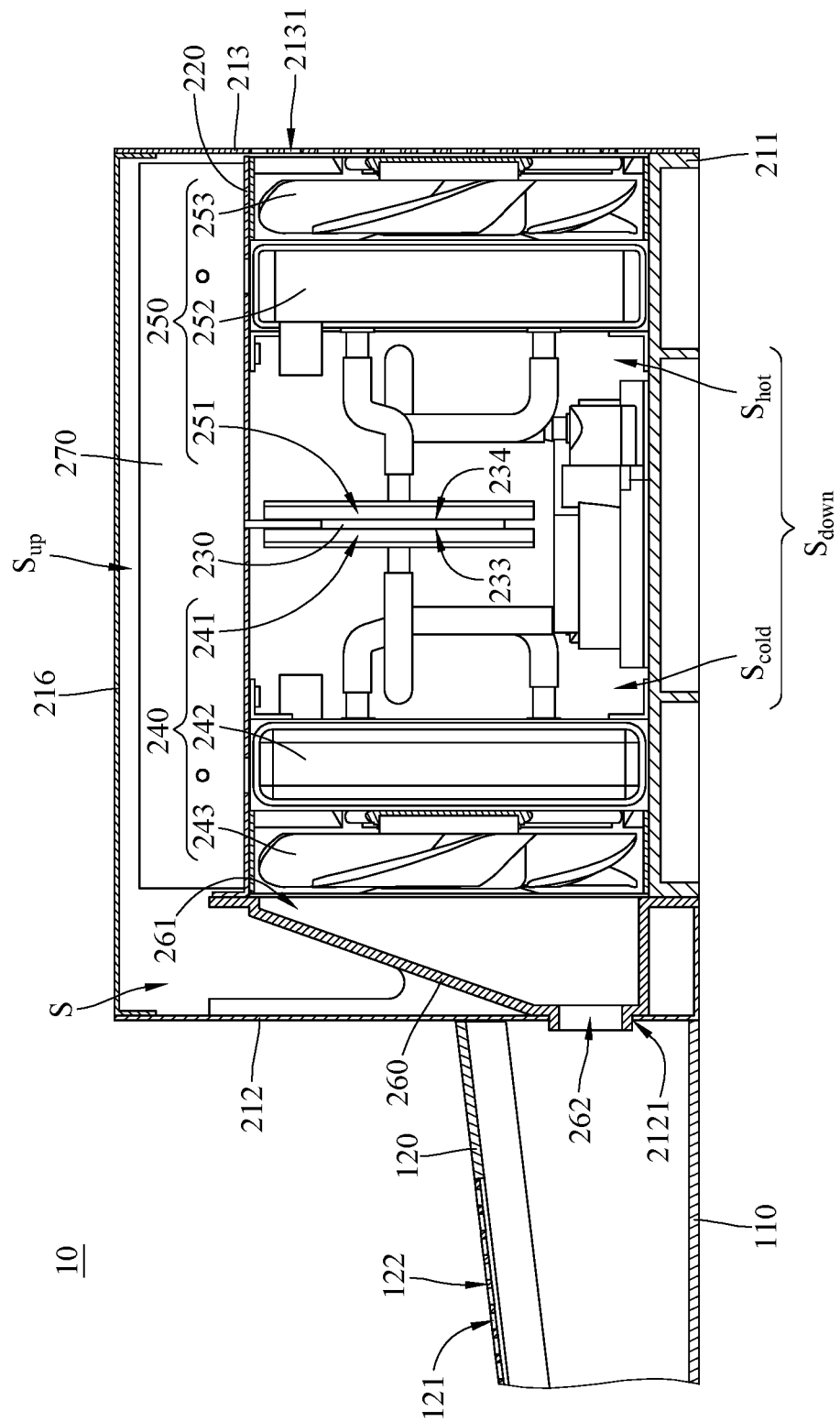
FIG. 4 is a cross-sectional view of the external heat dissipation device in FIG. 1 when the refrigerating device and an airflow-guiding base are assembled together.

Please refer to FIG. 1 to FIG. 4. FIG. 1 is an exploded view of an external heat dissipation device in accordance with a first embodiment of the disclosure, FIG. 2 is a perspective view of the external heat dissipation without showing a casing of a refrigerating device, FIG. 3 is a partial and exploded view of FIG. 2, and FIG. 4 is a cross-sectional view of the external heat dissipation device in FIG. 1 when the refrigerating device and an airflow-guiding base are assembled together.

In this embodiment, an external heat dissipation device 10 is provided. The external heat dissipation device 10 is configured to be applied to a portable electronic device (not shown in figures). The portable electronic device is, for example, a laptop computer (notebook computer) or a tablet computer. The external heat dissipation device 10 includes an airflow-guiding base 100 and a refrigerating device 200.

The airflow-guiding base 100 includes a base frame 110 and a supporting plate 120. The supporting plate 120 is pivotally coupled to the base frame 110 through a pivot 130 so that the supporting plate 120 can be pivoted to multiple inclined positions. The supporting plate 120 has a supporting surface 121 and a plurality of perforations 122. The supporting surface 121 is located on one side of the supporting plate 120 away from the base frame 110, and the supporting surface 121 is configured to support the portable electronic device. The perforations 122 are located on the supporting surface 121 and arranged in, but not limited to, arrays.

In this embodiment, the supporting plate 120 is pivotally coupled to the base frame 110, but the present disclosure is not limited thereto. In other embodiments, the supporting plate 120 may be immovably fixed to the base frame 110.

The refrigerating device 200 includes a casing 210, a partition plate 220, a plurality of thermoelectric coolers 230, a cold air transferring assembly 240 and a hot air transferring assembly 250. The casing 210 is, but not limited to, detachably disposed on the airflow-guiding base 100. The casing 210 includes a bottom plate 211, a front plate 212, a back plate 213, two side plates 214 and 215, and a top plate 216. The front plate 212, the back plate 213 and the two side plates 214 and 215 are respectively connected to different sides of the bottom plate 211. The front plate 212 are the back plate 213 are opposite to each other, and the two side plates 214 and 215 are opposite to each other. The top plate 216 is connected to sides of the front plate 212, the back plate 213 and the two side plates 214 and 215 which are away from the bottom plate 211, such that the bottom plate 211, the top plate 216, the front plate 212, the back plate 213 and the two side plates 214 and 215 together form a storage space S.

The partition plate 220 is located between the bottom plate 211 and the top plate 216 so as to divide the storage space S into an upper room $S_{up}$ and a lower room $S_{down}$. The side plates 214 has a plurality of vents 2141, and the side plates 215 has a plurality of vents 2151. The vents 2141 and 2151 are connected to the lower room $S_{down}$. The front plate 212 has a first air outlet 2121, and the first air outlet 2121 is connected to the lower room $S_{down}$. The first air outlet 2121 is connected to the perforations 122 of the supporting plate 120 (i.e., the first air outlet 2121 is in flow communication with the perforations 122). The back plate 213 has a plurality of second air outlets 2131, and the second air outlets 2131 are connected to the lower room $S_{down}$. The top plate 216 has a plurality of vents 2161, and the vents 2161 are connected to the upper room $S_{up}$.

The thermoelectric coolers 230 are located in the lower room $S_{down}$, and each of the thermoelectric coolers 230 is operated by electricity and has a cooling surface 233 and a heat releasing surface 234 opposite to each other while in operation. The cooling surface 233 can cool the ambient temperature so as to make it lower than room temperature. While the cooling surface 233 is cooling the ambient temperature, the heat releasing surface 234 of the thermoelectric coolers 230 generates heat.

In this embodiment, there are multiple thermoelectric coolers 230 arranged in a straight line in the refrigerating device 200, but the present disclosure is not limited thereto. In other embodiments, the refrigerating device may only include one thermoelectric cooler 230.

The cold air transferring assembly 240 is located in the lower room $S_{down}$, and the cold air transferring assembly 240 includes a first cooling plate 241 and a first cooling radiator 242 connected to each other. The first cooling plate 241 is in thermal contact with the cooling surfaces 233 of the thermoelectric coolers 230. The first cooling radiator 242 is located between the first cooling plate 241 and the first air outlet 2121. The first cooling plate 241 and the first cooling radiator 242 are able to accommodate coolant, and the coolant can be driven by, for example, a pump to flow through the first cooling plate 241 and the first cooling radiator 242 so as to form a circulation.

The hot air transferring assembly 250 is located in the lower room $S_{down}$, and the hot air transferring assembly 250 includes a second cooling plate 251 and a second cooling radiator 252 connected to each other. The second cooling plate 251 is in thermal contact with the heat releasing surfaces 234 of the thermoelectric coolers 230. The second cooling radiator 252 is located between the second cooling plate 251 and the second air outlets 2131. The second cooling plate 251 and the second cooling radiator 252 are able to accommodate coolant, and the coolant can be driven by, for example, a pump to flow through the second cooling plate 251 and the second cooling radiator 252 so as to form another circulation.

In this embodiment, the thermoelectric coolers 230 are clamped between the first cooling plate 241 and the second cooling plate 251, and the lower room $S_{down}$ is divided into a cold chamber $S_{cold}$ and a hot chamber $S_{hot}$ by the thermoelectric coolers 230, the first cooling plate 241, and the second cooling plate 251. The cold chamber $S_{cold}$ is connected to the first air outlet 2121, and the hot chamber $S_{hot}$ is connected to the second air outlets 2131. During the operation of the thermoelectric coolers 230, the cooling surfaces 233 of the thermoelectric coolers 230 become a cold source, and the heat releasing surfaces 234 of the thermoelectric coolers 230 generate heat, such that the cold chamber $S_{cold}$ on one side of the thermoelectric coolers 230 has a temperature lower than the room temperature, and the hot chamber $S_{hot}$ on another side of the thermoelectric coolers 230 has a temperature higher than the room temperature.

In addition, the cold air transferring assembly 240 further includes a first fan 243, and the hot air transferring assembly 250 further includes a second fan 253. The first fan 243 is located in the cold chamber $S_{cold}$, and the first fan 243 is configured to guide air from the first cooling plate 241 through the first cooling radiator 242 and then to the first air outlet 2121. The second fan 253 is located in the hot chamber $S_{hot}$, and the second fan 253 is configured to guide air from the second cooling plate 251 through the second cooling radiator 252 and then to the second air outlets 2131.

The external heat dissipation device 10 further includes an airflow-guiding cover 260. The airflow-guiding cover 260 has a flow entrance 261 and a flow exit 262 opposite to each other. The flow entrance 261 is larger than the flow exit 262. The flow entrance 261 is connected to the cold chamber $S_{cold}$. The flow exit 262 is connected to the perforations 122 (i.e., the flow exit 262 is in flow communication with the perforations 122). The airflow-guiding cover 260 is configured to guide the cold air having a temperature lower than the room temperature from the cold chamber $S_{cold}$ into the airflow-guiding base 100.

The external heat dissipation device 10 further includes a power supply 270. The power supply 270 is located in the upper room $S_{up}$, and the power supply 270 is electrically connected to the thermoelectric coolers 230. Furthermore, the heat generated by the power supply 270 is blocked by the partition plate 220, thus the heat is prevented from affecting the cold air in the cold chamber $S_{cold}$. Moreover, the heat generated by the power supply 270 may diffuse through the vents 2161 of the top plate 216 to the exterior of the refrigerating device 200, such that the temperature in the upper room $S_{up}$ is decreased and thus it prevents the power supply 270 from shutdown due to overheating.

In this embodiment, the heat generated by the power supply 270 diffusing through the vents 2161 but not the hot chamber $S_{hot}$ of the lower room $S_{down}$ can help to ease the burden of the hot air transferring assembly 250 on dissipating heat in the hot chamber $S_{hot}$. As a result, the cooling efficiency and required cooling time of the thermoelectric coolers 230 are prevented from being affected by high temperature.

When the portable electronic device is mounted on the supporting surface 121 of the supporting plate 120 and needs to be cooled, the external heat dissipation device 10 can be turned to activate the thermoelectric coolers 230, the first fan 243 and the second fan 253. When the first fan 243 is activated, the first fan 243 guides the cold air in the cold chamber $S_{cold}$ to the first air outlet 2121 and then to the perforations 122 of the supporting plate 120. Then, the portable electronic device on the supporting plate 120 can draw the cold air blown from the perforations 122 into itself for cooling heat sources therein. On the other hand, when the second fan 253 is activated, the second fan 253 expels the hot air having a temperature higher than the room temperature in the hot chamber $S_{hot}$ from the second air outlets 2131. As such, the hot air is transferred away from the portable electronic device as far as possible so as to prevent the portable electronic device from accidentally drawing the hot air and thus further improve the heat dissipation efficiency of the external heat dissipation device 10 to the portable electronic device; furthermore, the hot air from the external heat dissipation device 10 is prevented from being blown to a user.

In this embodiment, the lower room $S_{down}$ is divided into the cold chamber $S_{cold}$ and the hot chamber $S_{hot}$ by the thermoelectric coolers 230, the first cooling plate 241 and the second cooling plate 251, so the hot air in the hot chamber $S_{hot}$ does not easily flow back to the cold chamber $S_{cold}$, and thus the temperature of the cold air in the cold chamber $S_{cold}$ is not increased by the hot air. Therefore, the external heat dissipation device 10 is able to provide colder air to the portable electronic device, thereby increasing the heat dissipation effect of the external heat dissipation device to the portable electronic device.

Figure 5:
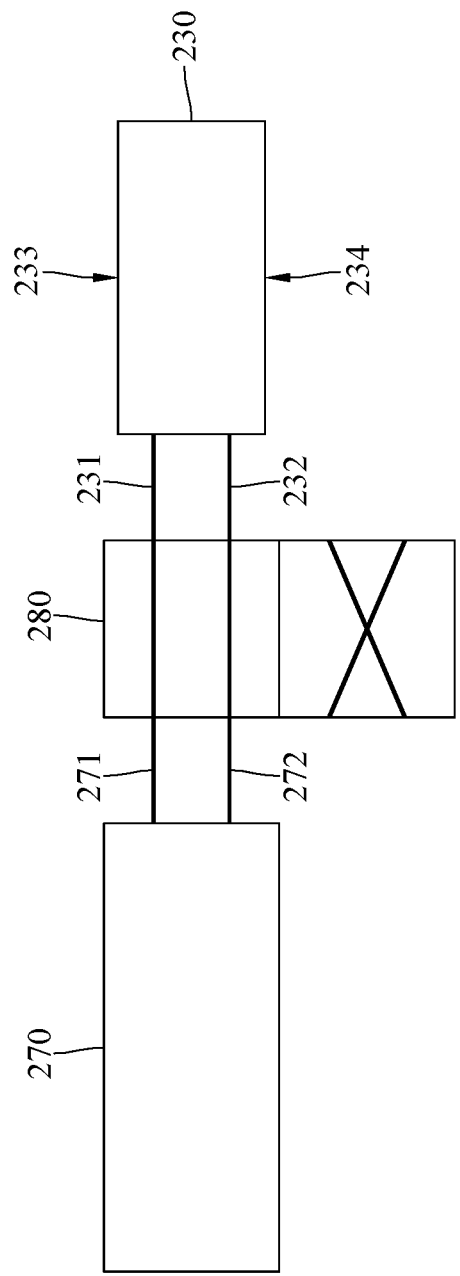
FIG. 5 is a schematic view of connection among a power supply, a switch and a thermoelectric cooler of the external heat dissipation device in FIG. 1.
Figure 6:
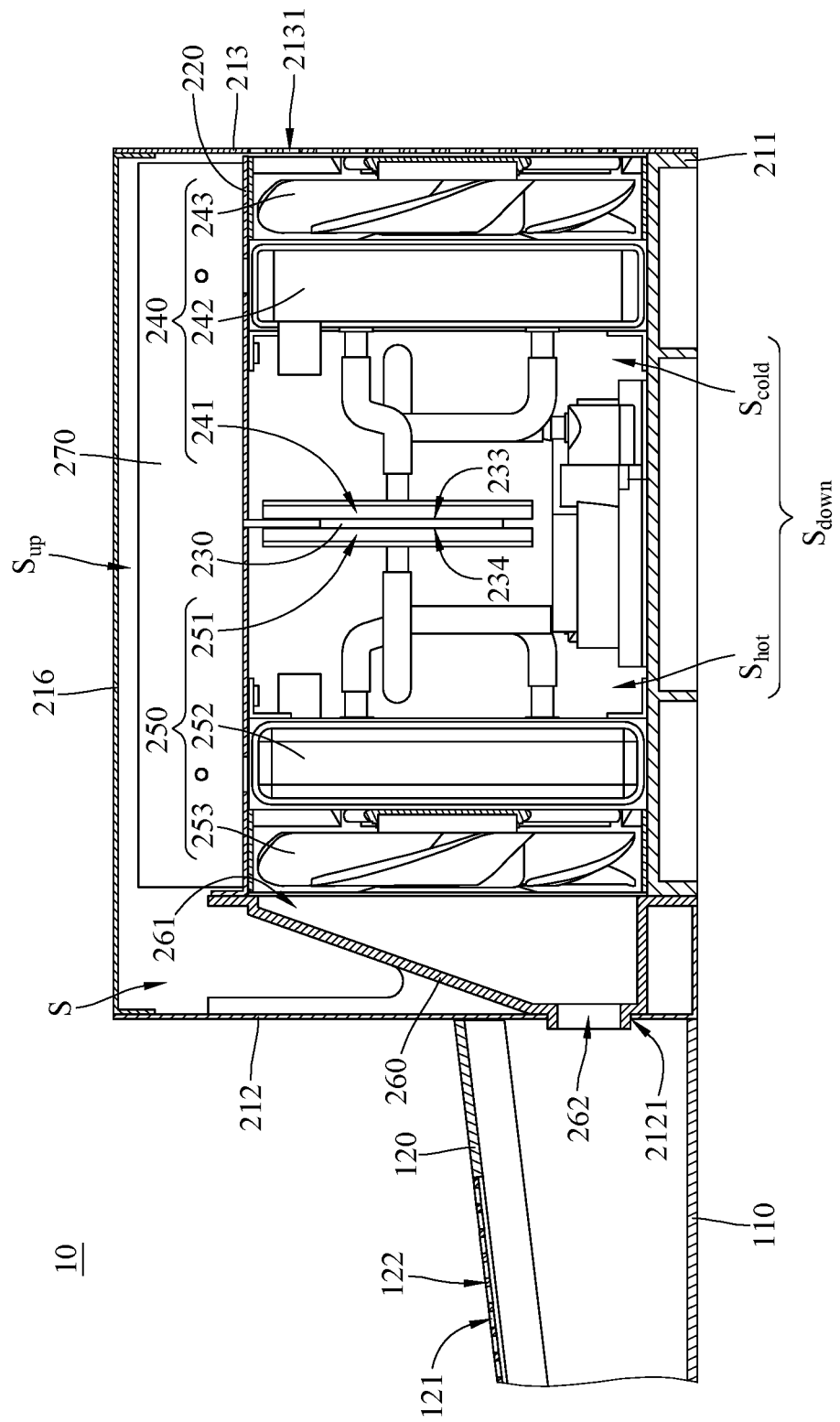
FIG. 6 is a cross-sectional view of the thermoelectric cooler in FIG. 4 while in another mode.

Please refer to FIG. 5 and FIG. 6. FIG. 5 is a schematic view of connection among a power supply, a switch and a thermoelectric cooler of the external heat dissipation device in FIG. 1, and FIG. 6 is a cross-sectional view of the thermoelectric cooler in FIG. 4 while in another mode. In this embodiment, the refrigerating device 200 further includes a switch 280. The switch 280 is configured for not only switching on and off the power supply 270 but also switching the operation modes of the thermoelectric coolers 230. In detail, at least one of the thermoelectric coolers 230 has a first anode 231 and a first cathode 232. The power supply 270 has a second anode 271 and a second cathode 272. The second anode 271 and the second cathode 272 of the power supply 270 are connected to the first anode 231 and the first cathode 232 of the thermoelectric coolers 230 through the switch 280. The switch 280 has a first switch mode and a second switch mode.

As shown in FIG. 4 and FIG. 5, when the switch 280 is in the first switch mode, the second anode 271 is connected to the first anode 231, and the second cathode 272 is connected to the first cathode 232, such that the cooling surfaces 233 of the thermoelectric coolers 230 face toward the first air outlet 2121 and the heat releasing surfaces 234 of the thermoelectric coolers 230 face toward the second air outlets 2131 (as shown in FIG. 4). That is, when the switch 280 is in the first switch mode, the refrigerating device 200 can cool the portable electronic device.

On the other hand, when the portable electronic device does not need to be cooled, the switch 280 can be switched to the second switch mode (as shown in FIG. 5 and FIG. 6). In the second mode, the second anode 271 is connected to the first cathode 232, and the second cathode 272 is connected to the first anode 231, such that the cooling surfaces 233 and the heat releasing surfaces 234 of the thermoelectric coolers 230 are switched places. At this moment, the cooling surfaces 233 face toward the second air outlets 2131, and the heat releasing surfaces 234 face toward the first air outlet 2121 (as shown in FIG. 6). That is, when the switch 280 is in the second switch mode, the refrigerating device 200 becomes a heater and is able to provide warm air to the user. In other words, the lower room $S_{down}$ is divided into a first chamber (e.g., the $S_{cold}$ in FIG. 4) and a second chamber (e.g., the $S_{hot}$ in FIG. 4) by the thermoelectric coolers 230, the first cooling plate 241, and the second cooling plate 251, and the first chamber and the second chamber are able to be switched to a cold chamber or a hot chamber according to the modes of the switch 280.

Accordingly, by switching the switch 280, the refrigerating device 200 can provide cold air to cool the portable electronic device or provide hat air to warm the user. As such, the refrigerating device 200 functions as a temperature adjusting device.

According to the external heat dissipation device and the temperature adjusting device as described above, the lower room is divided into the cold chamber and the hot chamber by the thermoelectric coolers, the first cooling plate, and the second cooling plate, the hot air in the hot chamber does not easily flow back to the cold chamber hot chamber, and thus the temperature of the cold air in the cold chamber is not increased by the hot air. Therefore, the external heat dissipation device is able to provide the cold air having lower temperature to the portable electronic device, thereby increasing the heat dissipation effect of the external heat dissipation device to the portable electronic device.

Furthermore, the power supply and the thermoelectric coolers are connected by the switch, and the switch can switch the operation modes of the thermoelectric coolers, such that the external heat dissipation device can function as a temperature adjusting device to optionally provide cold air or warm air. For example, when the portable electronic device needs to be cooled, the switch is switched to the desired mode so that cold chamber is connected to the first air outlet. For another example, by switching the switch, the hot chamber is able to be connected to the first air outlet so as to provide warm air to the user.

The embodiments were chosen and described in order to best explain the principles of the disclosure and its practical applications, to thereby enable others skilled in the art to best utilize the disclosure and various embodiments with various modifications as are suited to the particular use contemplated. It is intended that the scope of the disclosure be defined by the following claims and their equivalents.

What is claimed is:

1. An external heat dissipation device, configured to be applied to a portable electronic device, the external heat dissipation device comprising:
    an airflow-guiding base, having a supporting surface and at least one perforation, wherein the supporting surface is configured to support the portable electronic device, and the at least one perforation is located on the supporting surface; and
    a refrigerating device, comprising:
        a casing, having a storage space, at least one vent, a first air outlet and a second air outlet, wherein the at least one vent is connected to the storage space, and the first air outlet is connected to the at least one perforation;
        a partition plate, located in the storage space, wherein the storage space is divided into an upper room and a lower room by the partition plate;
        at least one thermoelectric cooler, located in the lower room of the storage space, wherein the at least one thermoelectric cooler has a cooling surface and a heat releasing surface opposite to each other;
        a power supply, located in the upper room and electrically connected to the thermoelectric cooler;
        a cold air transferring assembly, located in the lower room and comprising a first cooling plate and a first cooling radiator connected to each other, wherein the first cooling plate is in thermal contact with the cooling surface of the thermoelectric cooler; and
        a hot air transferring assembly, located in the lower room and comprising a second cooling plate and a second cooling radiator connected to each other, wherein the second cooling plate is in thermal contact with the heat releasing surface of the thermoelectric cooler;
    wherein the storage space is divided into a cold chamber and a hot chamber by the thermoelectric cooler, the first cooling plate, and the second cooling plate, the cold chamber is connected to the first air outlet, the hot chamber is connected to the second air outlet, and the thermoelectric cooler, the first cooling plate and the second cooling plate are vertically disposed in the lower room so as to divide the lower room into the cold chamber and the hot chamber.

2. The external heat dissipation device according to claim 1, wherein the casing comprises a bottom plate, a front plate, a back plate, two side plates and a top plate; the front plate, the back plate and the two side plates are respectively connected to different sides of the bottom plate, the front plate and the back plate are opposite to each other, the two side plates are opposite to each other, the top plate is connected to sides of the front plate, the back plate and the two side plates away from the bottom plate such that the bottom plate, the top plate, the front plate, the back plate and the two side plates together form the storage space, the partition plate is located between the bottom plate and the top plate so as to divide the storage space into the upper room and the lower room, the at least one vent is located on one of the side plates, the first air outlet is located on the front plate, and the second air outlet is located on the back plate.

3. The external heat dissipation device according to claim 2, wherein the top plate has another vent which is connected to the upper room.

4. The external heat dissipation device according to claim 1, wherein the refrigerating device further comprises an airflow-guiding cover, the airflow-guiding cover has a flow entrance and a flow exit opposite to each other, the flow entrance is larger than the flow exit, the flow entrance is connected to the cold chamber, and the flow exit is connected to the perforation.

5. The external heat dissipation device according to claim 1, wherein the cold air transferring assembly further comprises a first fan, the first fan is located in the cold chamber, and the first fan is configured to guide air through the first air outlet to the at least one perforation.

6. The external heat dissipation device according to claim 5, wherein the hot air transferring assembly further comprises a second fan, the second fan is located in the hot chamber, and the second fan is configured to guide air to the second air outlet.

7. The external heat dissipation device according to claim 1, wherein the casing of the refrigerating device is detachably disposed on the airflow-guiding base.

8. The external heat dissipation device according to claim 1, wherein the airflow-guiding base comprises a base frame and a supporting plate, the supporting plate is pivotally coupled to the base frame so that the supporting plate is pivotable to multiple inclined positions, and the supporting surface is located on one side of the supporting plate away from the base frame.

9. The external heat dissipation device according to claim 1, wherein the quantity of the at least one thermoelectric cooler is plural, the thermoelectric coolers are arranged in a straight line, and the thermoelectric coolers are clamped between the first cooling plate and the second cooling plate.

10. A temperature adjusting device, comprising:
- a casing, having a storage space, at least one vent and a first air outlet, wherein the at least one vent is connected to the storage space, and the first air outlet is configured to be connected to at least one perforation of an airflow-guiding base;
- a partition plate, located in the storage space, wherein the storage space is divided into an upper room and a lower room by the partition plate;
- at least one thermoelectric cooler, located in the lower room, wherein the at least one thermoelectric cooler has a cooling surface and a heat releasing surface opposite to each other, and the at least one thermoelectric cooler has a first anode and a first cathode;
- a cold air transferring assembly, located in the lower room, wherein the cold air transferring assembly comprises a first cooling plate and a first cooling radiator connected to each other, the first cooling plate is in thermal contact with the cooling surface of the thermoelectric cooler;
- a hot air transferring assembly, located in the lower room, wherein the hot air transferring assembly comprises a second cooling plate and a second cooling radiator connected to each other, the second cooling plate is in thermal contact with the heat releasing surface of the thermoelectric cooler;
- a power supply, located in the upper room and electrically connected to the thermoelectric cooler, wherein the power supply has a second anode and a second cathode; and
- a switch;
- wherein the first anode and the first cathode of the thermoelectric cooler are connected to the second anode and the second cathode of the power supply through the switch, and a connection among the first anode, the first cathode, the second anode and the second cathode is switchable by the switch so as to blow a cold air generated by the cooling surface of the thermoelectric cooler toward the first air outlet or to blow a hot air generated by the heat releasing surface of the thermoelectric cooler toward the first air outlet; and
- wherein the thermoelectric cooler, the first cooling plate and the second cooling plate are vertically disposed in the lower room so as to divide the lower room into a first chamber and a second chamber.

11. The temperature adjusting device according to claim 10, the first chamber is connected to the first air outlet, and the second chamber is connected to the second air outlet.

12. The temperature adjusting device according to claim 10, wherein the casing comprises a bottom plate, a front plate, a back plate, two side plates and a top plate; the front plate, the back plate and the two side plates are respectively connected to different sides of the bottom plate, the front plate and the back plate are opposite to each other, the two side plates are opposite to each other, the top plate is connected to sides of the front plate, the back plate and the two side plates away from the bottom plate such that the bottom plate, the top plate, the front plate, the back plate and the two side plates together surround and form the storage space, the partition plate is located between the bottom plate and the top plate so as to divide the storage space into the upper room and the lower room, the at least one vent is located on one of the side plates, the first air outlet is located on the front plate, and the second air outlet is located on the back plate.

13. The temperature adjusting device according to claim 12, wherein the top plate has another vent which is connected to the upper room.

14. The temperature adjusting device according to claim 10, wherein the cold air transferring assembly further comprises a first fan, the first fan is located in the first chamber, and the first fan is configured to guide air to the first air outlet.

15. The temperature adjusting device according to claim 14, wherein the first cooling radiator is located between the first cooling plate and the first fan.

16. The temperature adjusting device according to claim 15, wherein the hot air transferring assembly further comprises a second fan, the second fan is located in the second chamber, and the second fan is configured to guide air to the second air outlet.

17. The temperature adjusting device according to claim 16, wherein the second cooling radiator is located between the second cooling plate and the second fan.

18. The temperature adjusting device according to claim 10, wherein the quantity of the at least one thermoelectric cooler is plural, the thermoelectric coolers are arranged in a straight line, and the thermoelectric coolers are clamped between the first cooling plate and the second cooling plate.

19. The temperature adjusting device according to claim 10, further comprising an airflow-guiding cover, wherein the airflow-guiding cover has a flow entrance and a flow exit opposite to each other, the flow entrance is larger than the flow exit, the flow entrance is connected to the first chamber, and the flow exit is connected to the first air outlet.

* * * * *